INVENTORS
MARSHALL I. NATHAN
JOHN E. SMITH, JR.

BY John E. Dougherty Jr
ATTORNEY 2 ohm-cm. N TYPE
Ge
[1̄12] CURRENT
[110] STRESS
27°K United States Patent Office 3,480,879

Patented Nov. 25, 1969

3,480,879

BULK OSCILLATOR USING STRAINED SEMICONDUCTOR

Marshall I. Nathan, Mount Kisco, and John E. Smith, Jr., Ossining, N.Y., assignors to International Business Machines Corporation, Armonk, N.Y., a corporation of New York Filed Jan. 4, 1968, Ser. No. 695,681

Int. Cl. H03b *5/12, 5/24, 5/36*

U.S. Cl. 331—107 19 Claims

ABSTRACT OF THE DISCLOSURE

The active component of the oscillator is a body of N type germanium. Ohmic noninjecting connections are made to the body which is so oriented that a voltage applied between these contacts is paralleled to a [11$\bar{2}$] crystallographic direction. A compressive stress is applied in a direction which is perpendicular to the direction of applied voltage and oriented to be paralleled to the [111] direction. A negative bulk conductivity due to intervalley transfer and high frequency oscillations are produced when the applied field and stress are raised above critical values.

FIELD OF INVENTION

The invention relates to semiconductor oscillators in which oscillations are produced by current instabilities in the bulk of the semiconductor body. The oscillations are derived from a negative resistance produced by an intervalley transfer in a body of semiconductor material to which stress is applied. The oscillations do not require a junction, nor the injection of minority carriers, and can be produced in a single conductivity type of semiconductor material such as germanium.

PRIOR ART

The pertinent prior art is as follows.

(a) British Patent No. 849,475 by J. B. Gunn, published Sept. 28, 1960.

(b) U.S. Patent No. 3,215,926, issued Nov. 2, 1965 to E. Erlbach.

(c) An article entitled, "Observation of Instability in Semiconductors Caused by Heavily Injected Minority Carriers," by Makoto Kikuchi and Yutaka Abe, which appeared in the Journal of the Physical Society of Japan, vol. 17, p. 1268, August 1962.

(d) An article by J. B. Gunn entitled, "Instabilities of Current and Potential Distribution in GaAs and InP," which appeared in Plasma Effects in Solids, New York Academic Press, 1965, pp. 199–207.

(e) An article by J. A. Copeland entitled, "Theoretical Study of a Gunn Diode in a Resonant Circuit," which appeared in the IEEE Transactions for Electron Devices, vol. ED–14, p. 55, February 1967.

(f) An article by J. J. Hall and M. I. Nathan, which appeared in the IBM Technical Disclosure Bulletin, vol. 8, No. 4, September 1965, pp. 651–652.

(g) An application Ser. No. 660,461, filed on Aug. 14, 1967 in behalf of J. C. McGroddy and M. I. Nathan and commonly assigned.

(h) An article by A. A. Kastal'ski et al. entitled, "Gunn Effect in Uniaxially Compressed Germanium," which appeared in Fizika I Tekhnika Poluprovodnikov (Akad. Nauk. SSSR), vol. 1, No. 4, pp. 622–625 (April 1967).

As is illustrated in the prior art listed above, "Gunn-Effect" type of GaAs oscillators have been realized in a number of different configurations. Devices of this type have been operated in a transit time mode in which the frequency of operation is dependent upon the length of the semiconductor body, and domain quenching and limited space charge accumulation modes. Oscillators of this type have also been produced in other materials similar to GaAs, such as InP. It has been suggested that it might be possible to achieve oscillations by an intervalley transfer between normally equivalent valleys in materials such as Ge by the application of stress to a germanium body. In fact oscillations have been reported in P type germanium under certain conditions (above-cited article by Kastal'ski et al.).

SUMMARY OF THE INVENTION

The semiconductor oscillators of the present invention are operated by applying a combination of stress and current to a semiconductor body having an excess of charge carriers of one conductivity type. The carriers are normally located in two or more equivalent low energy valleys in the material which are in the absence of stress at the same energy level. It is necessary that these energy valleys have constant energy surfaces which are anisotropic, and the stress is applied to the bodies to maximize the energy splitting which can be achieved between the normally equivalent energy valleys. The current is applied in a direction to maximize the ratio of the mass of the electrons in the high energy valleys to the mass of electrons in the low energy valleys. Further, it has been discovered that when stress is applied to devices of this type, the characteristic for the device depicting the relationship between applied stress and the threshold field necessary to produce oscillations includes a narrow range of applied stress at which the threshold field is minimized. By operating the devices in this way, oscillations can be produced efficiently at threshold fields which are lower than those required with other semiconductor oscillators.

It is therefore an object of the present invention to provide a new and improved high frequency oscillator.

It is a further object to provide a new and improved method for producing high frequency oscillations in a semiconductor body.

Another object of the present invention is to provide an oscillator of the above described type which can be fabricated in readily available semiconductor material, such as germanium, in which the purity and doping concentrations can be closely controlled.

It is a further object of the present invention to provide a semiconductor oscillator which can be operated under stress at a low threshold field, therefore allowing the production of high power outputs.

It is a more specific object of the present invention to provide a method of producing high frequency oscillators, using as an active device a body of germanium to which stress and electric fields are applied in orientations to maximize the efficiency of oscillators.

The foregoing and other objects, features and advantages of the invention will be apparent from the following more particular description of preferred embodiments of the invention, as illustrated in the accompanying drawings.

DESCRIPTION OF PREFERRED EMBODIMENTS

Figure 1:
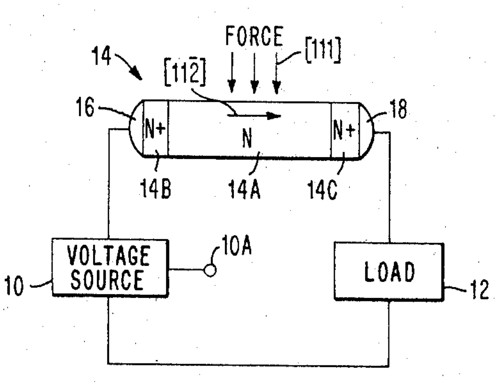
FIG. 1 is a diagrammatic representation of a circuit employed in the practice of the present invention.

The oscillator circuit shown in FIG. 1, which illustrates a preferred mode of practicing the invention, includes a voltage source 10, a load 12 and an active semiconductor device generally designated 14. Device 14 is formed of a crystal of germanium to the opposite ends of which there are affixed two contacts, 16 and 18. Contacts 16 and 18 are ohmic contacts which do not inject minority carriers into the germanium body. The germanium crystal includes a center portion 14A, which is slightly N type, and two end portions 14B and 14C, which are also N type, but have a higher concentration of excess electrons than the center portion 14A. To be more specific, in this illustrative embodiment, the N type dopant is antimony and the carrier concentration in the central portion 14A is preferably in a range between $8\times10^{14}$ to $1.1\times10^{16}$ carriers per $cm.^3$. The room temperature resistivity for this range of carrier concentration is between 2 ohms-cm., and .1 ohm-cm.

As is indicated by the arrow located in the center portion 14A of crystal 14, the body of germanium is oriented so that the length of the body extending between contacts 16 and 18 is parallel to the $[11\bar{2}]$ crystalline direction in the semiconductor material. A compressive force or stress is applied to the crystalline body, as indicated by the arrows located at the top of the body, in a direction parallel to the [111] crystalline direction which is perpendicular to the $[11\bar{2}]$ direction. When this applied force, which strains the body of germanium, exceeds a threshold for the particular temperature of operation, high frequency oscillations can be generated by the application of a voltage which exceeds a threshold voltage for the device under these conditions. The voltage is applied between contacts 16 and 18 by voltage source 10 under the control of activating signals applied at a terminal 10A. The high frequency current oscillations are produced in the germanium device and are delivered to load 12.

These oscillations are produced as the result of a negative resistance produced in the germanium body as the result of a transfer of electrons from a low energy valley in which the electrons have high mobility to a higher energy valley in which the electrons have a low mobility. This negative resistance produces a localized instability in the germanium body, which is usually termed a high field domain. This domain propagates through the body from the point at which it is nucleated to the point at which it is extinguished. Only one domain exists in the body at any one time. The conductivity of the body is lower when the domain is present and returns to its normal value during the time between the extinguishing of one domain and the nucleation of the next domain. The phenomenon responsible for this type of oscillation in a body of semiconductor material is termed the "Gunn-Effect" and has been described in detail in the prior art listed above. The mode of oscillation here depicted in which the frequency is dependent upon the transit time for a domain between its point of nucleation and its point of extinction is usually termed a transit type mode of operation for such a device. In the specification, only this mode is described in detail, though it will be understood by those skilled in the art that other modes of operation can be employed in which the nucleation and/or propagation of the domain or instability are controlled by the circuit attached to the active semiconductor body. In these domain quenching or limited space accumulation modes the frequency of operation is not limited by the length of the device and higher power outputs are realized.

Thus the load 12, shown in FIG. 1, may be a resistive load, or a reactive load designed for one of the above described modes of operation. One example of a reactive load is illustrated in FIG. 1B, in which the load includes resistive, capacitive and inductive components. The load 12 in any case need not consist of discrete elements but may be in the form of a cavity or waveguide which either completely or partially contains the semiconductor body 14 and is electromagnetically coupled to the body.

Figure 1A:
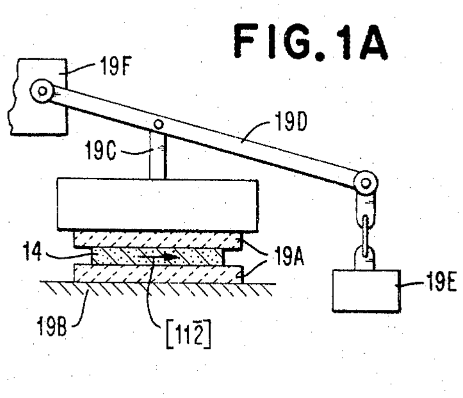
FIG. 1A is a diagrammatic illustration of the manner in which stress is applied to the semiconductor body which is the active element in the embodiments of the present invention.
Figure 1B:
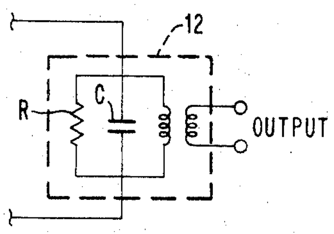
FIG. 1B, shows in more detail a particular load circuit which may be used in the circuit of FIG. 1.
Figure 2:
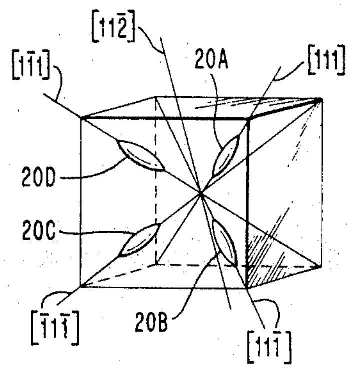
FIGS. 2, 2A, and 2B are illustrations of the conduction band energy valleys as they exist in momentum space in germanium.
Figure 2A:
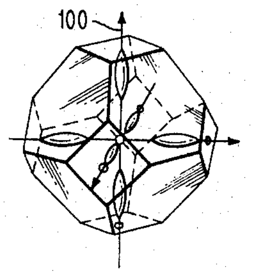
Figure 2B:
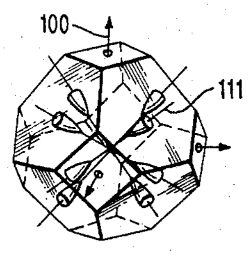

In order to provide a clearer understanding of the type of intervalley transfer that is necessary to produce the oscillations described above and the relationships which must exist between the direction of the applied stress and current flow in the device, reference is made first to FIG. 1A, which indicates one method of applying the in somewhat diagrammatic form the energy valleys which stress, and then to FIGS. 2, 2A and 2B, which illustrate exist in germanium.

The germanium body 14 with the contacts affixed and electrical connections made to these contacts, which contacts and connections are not shown in FIG. 1A, is mounted, as shown in FIG. 1A, between the pair of polished optically flat blocks of sapphire 19A. The lower one of these blocks of sapphire is mounted on a fixed support 19B and the upper one of these blocks of sapphire is connected to a support which is in turn mounted on a moveable rod 19C. Rod 19C is connected to a further rod 19D, one end of which is pivotally mounted to a fulcrum 19F, and the other end of which is connected to a weight 19E. Weight 19E may be a single element, or may be in the form of a container into which discrete weights are placed in order to vary the stress applied to the germanium body. The applied stress is a uniaxial stress, and other methods and structures for applying this stress to the germanium may be also employed. The stress may be applied externally as in FIG. 1A or the required stress may be built into the germanium body itself.

FIG. 2 illustrates the four lowest energy conduction band valleys which lie along <111> directions in momentum space in germanium. The notation used in this application to express different crystalline orientations is conventional. The particular direction is represented by three coordinates (e.g., 111). A specific single direction within the crystal is designated by the use of the symbols [---] (e.g., [111]). Where the direction to be indicated is any one of a plurality of symmetrically equivalent directions, the symbols <---> are used (e.g., <111>). Thus, the indication <111> specifies any one of the four possible 111 directions in the crystalline body each of which can be expressed in one or the other of two different complementary forms as indicated below.

$$[111]=[\bar{1}\bar{1}\bar{1}]$$
$$[\bar{1}11]=[1\bar{1}\bar{1}]$$
$$[1\bar{1}1]=[\bar{1}1\bar{1}]$$
$$[11\bar{1}]=[\bar{1}\bar{1}1]$$

The four energy valleys depicted in FIG. 2 are the lowest energy valleys in the conduction band and are located along <111> directions in the germanium crystal. Each of these valleys is anisotropic, having a constant energy surface in the form of an ellipsoid the major axis of which is along one of the four <111> directions in the germanium material. FIGS. 2A and 2B are a more exact representation of the valleys as they exist in germanium. In FIG. 2A, six valleys are illustrated which lie along <100> directions in the germanium material and a seventh valley which is centrally located. These valleys are higher energy valleys and are not believed to take any part in the generation of the oscillations produced in accordance with the principles of the present invention. In FIG. 2B, the four lower energy valleys, which are depicted as complete ellipsoids in FIG. 2, are shown as eight valleys along the same <111> directions, each of which is half an ellipsoid. Though the showing of FIG. 2B is somewhat more exact, the simpler representation of FIG. 2 is sufficient for understanding the phenomenon underlying the present invention.

The four energy valleys depicted in FIG. 2, in the absence of applied strain, are at the same energy level and normally the excess electrons in the N type germanium are located in these valleys. Since all of these valleys are at the same energy level they do not present the correct type of environment for the type of intervalley transfer necessary to produce a negative resistance within the germanium body. However, these energy levels can be split by the application of stress to the body in properly chosen directions. Further, the mass of electrons in any one of the four valleys shown and, therefore, the mobility of the electrons which is inversely proportional to their mass, depends upon the direction in which an electric field is applied to produce current flow in the body. This anisotropy in the mass of the electrons in the various valleys is due to the fact that the constant energy surfaces of the valleys are anisotropic. Thus, for example, when a current is applied in a direction parallel to the [111] direction, the electrons in the valley lying along that direction (the major axis of the ellipsoid being parallel to the [111] direction) have a very high mass and low mobility for this direction of current flow. The other three valleys are symmetrically located with respect to this direction of current flow and have an equal, but appreciably lower, mass and, therefore, higher mobility.

As was pointed out above in the description of the preferred embodiment illustrated in FIG. 1, a compressive stress is applied to the germanium along the [111] direction. This stress has the effect of lowering the energy in the valley 20A lying along this direction and of raising the energy in the other three valleys, 20B, 20C and 20D. The amount by which the valleys are split in energy increases as the applied stress is increased until the point is reached at which the application of a sufficient electric field in a proper direction produces the instability necessary for the high frequency oscillations. In the embodiment of FIG. 1, the field is applied and the current flows in the [11$\bar{2}$] direction in the crystal. This direction of current flow is at right angles to the [111] direction in which the stress is applied. The current flow is, therefore, at right angles to the ellipsoid 20A representing the energy valley lying along the direction of the applied stress. The electrons in this valley 20A have a relatively low mass and high mobility for this direction of current flow.

The current flow in the [11$\bar{2}$] direction is more nearly parallel to the energy valley 20B lying along the [11$\bar{1}$] direction in the semiconductor material and the electrons in this valley for this direction of current flow have a relatively high mass and relatively low mobility. The other two valleys 20D and 20C, which are also changed in energy by the application of the stress, are more nearly perpendicular than parallel to the applied stress and, therefore, the electrons in these valleys have a mass which is only slightly greater than that of the electrons in valley 20A and significantly less than the mass of the electrons in valley 20B.

Figure 6:
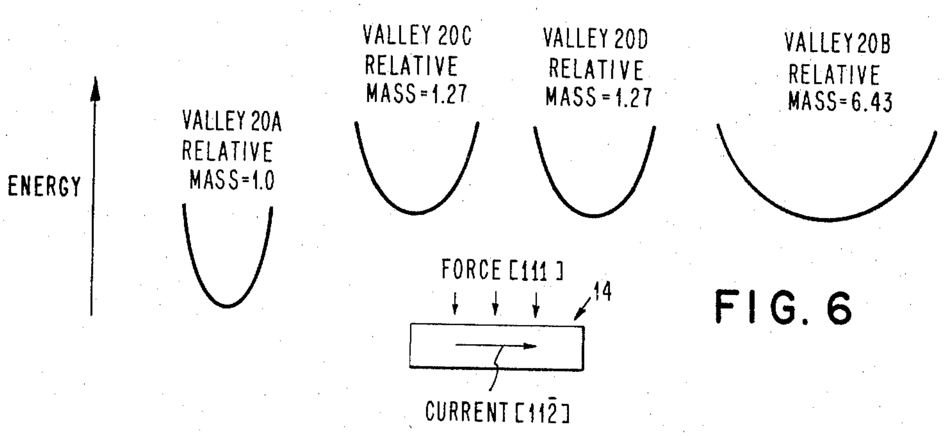
FIGS. 6, 7, and 8 are plots depicting the energy relationships between the four <111> valleys in germanium as well as the relative masses of the electrons in these fields for different combinations of applied stress and current.

These relationships are shown in more detail in FIG. 6. This figure shows the manner in which the energy of the three valleys 20B, 20C and 20D are raised relative to the energy of valley 20A by the application of stress along the [111] direction. As shown, all three of these valleys 20B, 20C and 20D are at the same energy level since all three have their energy raised at the same rate by the applied stress which is symmetrical with respect to these three valleys. The relative mass of electrons in the four valleys is also indicated in this figure for current flow in the [11$\bar{2}$] direction. The mass in the lower energy valley 20A is represented as 1.0 and, as can be seen, the mass of the electrons in the very heavy valley 20B for this mode of operation is approximately 6½ times as great as that of electrons in valley 20A. In the intermediate valleys 20C and 20D, the electrons have a mass which is 1.27 times as great as that for the electrons in valley 20A.

Figure 3A:
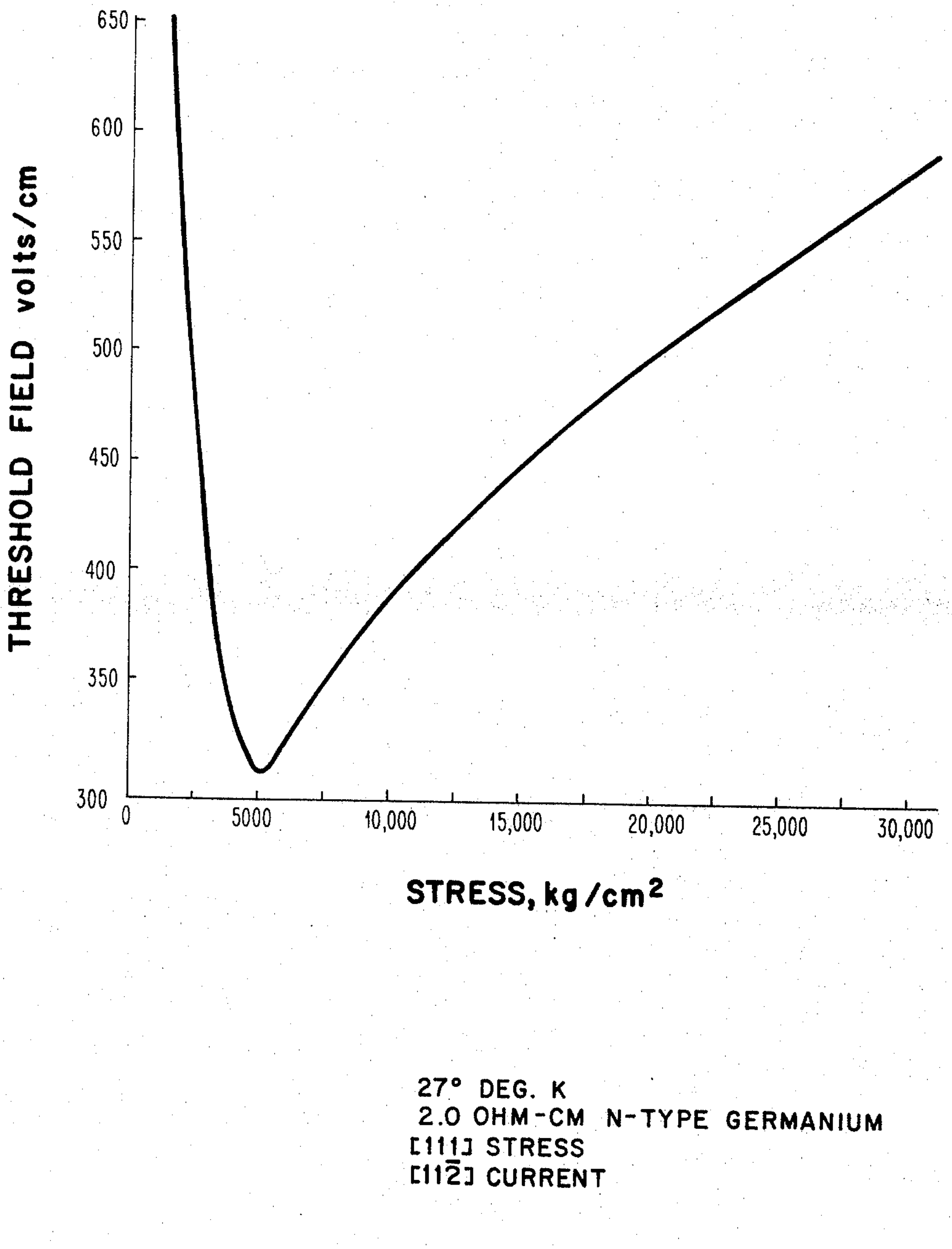
FIGS. 3A and 3B are curves depicting the relationship between applied stress and the threshold field necessary to produce oscillations in devices of the present invention.

FIG. 3A shows the relationship between applied stress and the threshold field at which oscillations are produced in a germanium device of the type shown in FIG. 1. The device whose characteristics are shown in this figure was operated at 27° K. by a cooling apparatus of a conventional type which is not shown in FIG. 1. The germanium body has a room temperature resistivity of 2 ohm-cm., being doped with antimony to a concentration of about $8\times10^{14}$ atoms per $cm.^3$. Oscillations were originally observed at an applied stress of about 2000 kg. per $cm.^2$ applied along the [111] direction of the germanium crystal. The threshold field at which oscillations are first observed for this applied stress is about 650 volts per cm. As the applied stress is increased, the threshold field decreases until a minimum threshold field for the production of oscillations is exhibited for an applied stress of about 5000 kg. per $cm.^2$. Thereafter, as the stress is increased, the threshold field necessary to be applied to produce oscillations, also increases. This curve illustrates a very important characteristic of the device operated in accordance with the present invention. There is an optimum stress which should be applied to the germanium crystal in the preferred direction to allow operation of the device at the minimum threshold field. The amplitude of the oscillation produced is not increased significantly when the field applied is increased above threshold. Further, the intensity of the field which must be applied before the threshold is reached to produce oscillations is one of the more important parameters in operating oscillators of this type to produce high power outputs.

Figure 3B:
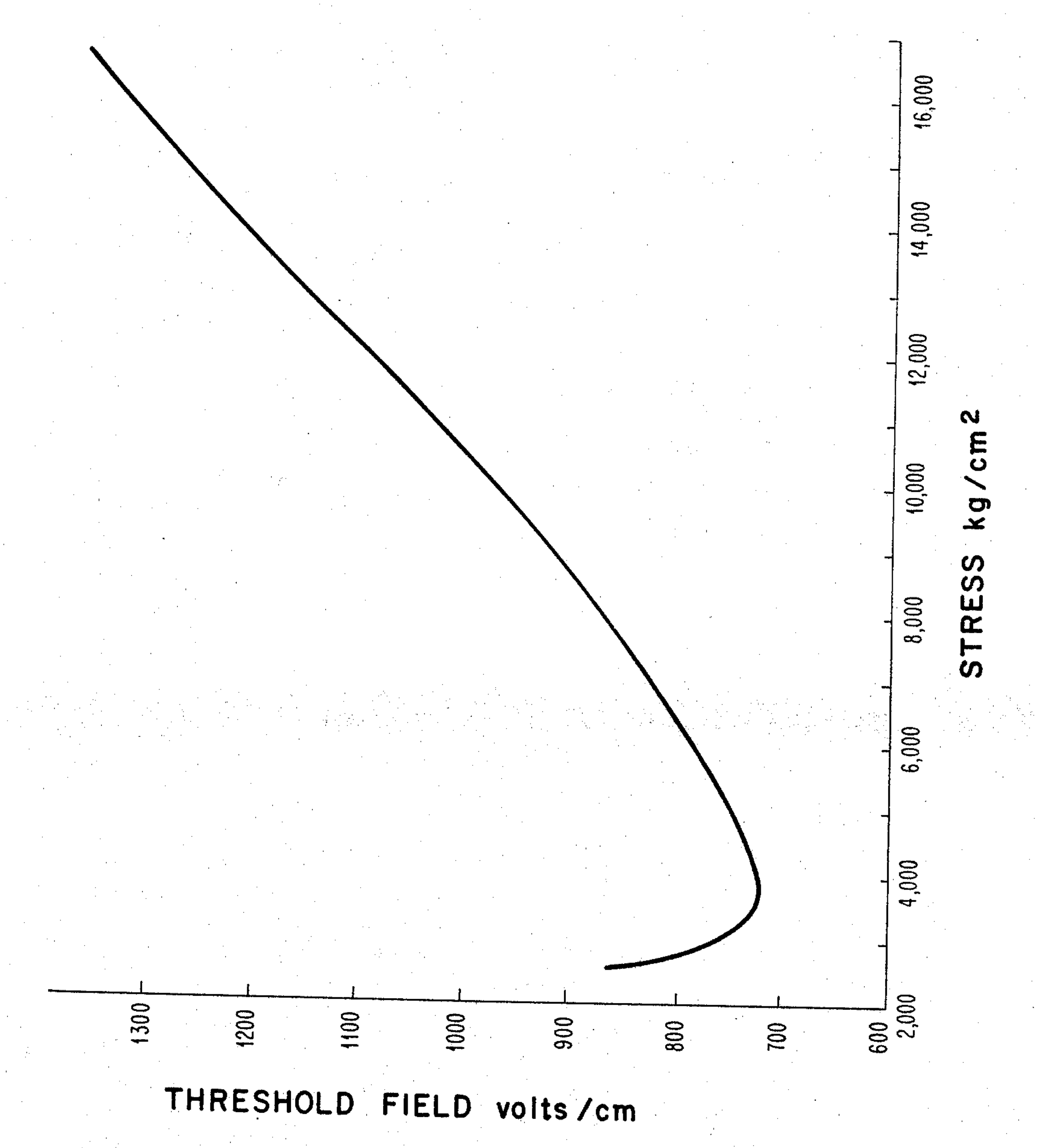
Figure 7:
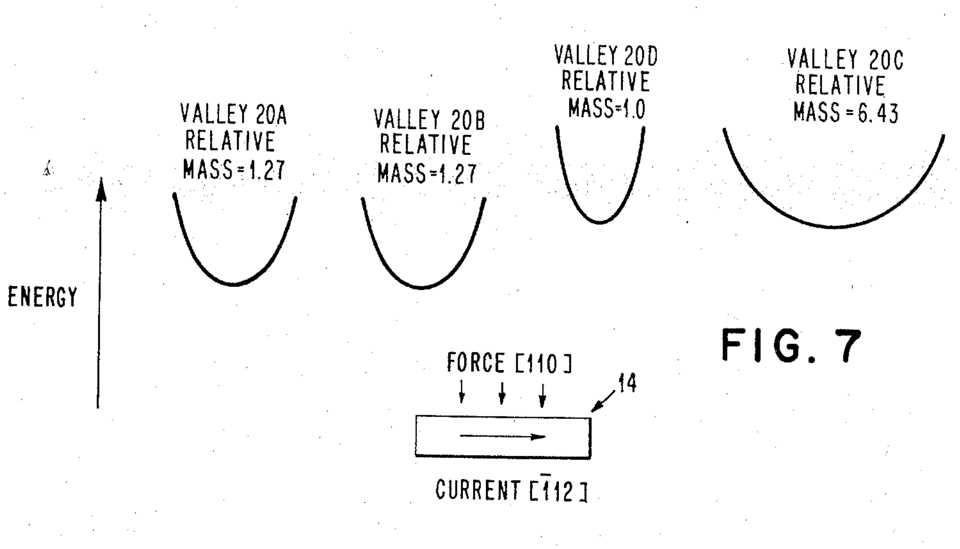

A curve similar to that shown in FIG. 3A is depicted in FIG. 3B. The operating characteristic of this latter figure is also for a semiconductor device of the type shown in FIG. 1 using 2 ohm-cm. germanium doped with antimony and operated at a temperature of 27° K. The device operation differs, however, from that of the devices described thus far in that the germanium crystal is oriented so that the current flows between the contacts 16 and 18 parallel to a [$\bar{1}$12] direction in the crystal and the stress is applied at right angles to this current along the [110] direction in the crystal. When a stress is applied in this direction to the crystal it is not parallel to any one of the <111> directions along which the low energy valleys in germanium normally lie. As a result, for stress applied in this direction, the energy splitting of the valleys produced per unit of applied stress is not as great. When the stress is applied along the [110] direction, and the current is along the [$\bar{1}$12] direction the energy relationships and relative masses for the four valleys are shown in FIG. 7. Two of the valleys, 20C and 20D, are at a high energy level and the other two valleys 20A and 20B are at a low energy level. These latter two valleys, for the current applied in the [$\bar{1}$12] direction, have a mass which is slightly higher than that of valley 20D. Valley 20D, though it is raised in energy by the applied stress, exhibits the lowest mass for its electrons since the current flow in the [$\bar{1}$12] direction is perpendicular to the major axis of the ellipsoid of this valley. The highest mass or heaviest valley, for the mode of operation depicted in FIG. 7 is valley 20C which is more nearly parallel to the direction of the applied current.

Though oscillations have been produced with the mode of operation depicted in FIG. 7, as can be seen from FIG. 3B, much higher threshold fields must be applied to achieve the oscillations. However, as before, there is a minimum threshold field, about 720 volts per cm., at which oscillations are produced when the applied stress is about 3600 kg. per cm.$^2$. Thus, the crystalline orientation of FIG. 7 is not as favorable for the production of the oscillations as that shown in FIG. 6. This is further demonstrated by the further fact that with the orientation of FIG. 7, oscillations have been achieved only at lower temperatures in the neighborhood of 27° K. However, it is possible that oscillations at higher temperatures can be achieved with this orientation using different resistivity material. When the orientation is as shown in FIG. 6, with the strain applied directly to one of the $\langle 111 \rangle$ directions and the current along a 112 direction which is at right angles to the direction of applied stress, oscillations have been obtained not only at 27° K., but also at 77° K. and at 300° K. (room temperature). These oscillations were obtained with devices having the same resistivity as depicted in FIG. 3A, that is, 2 ohm-cm.

Figure 4:
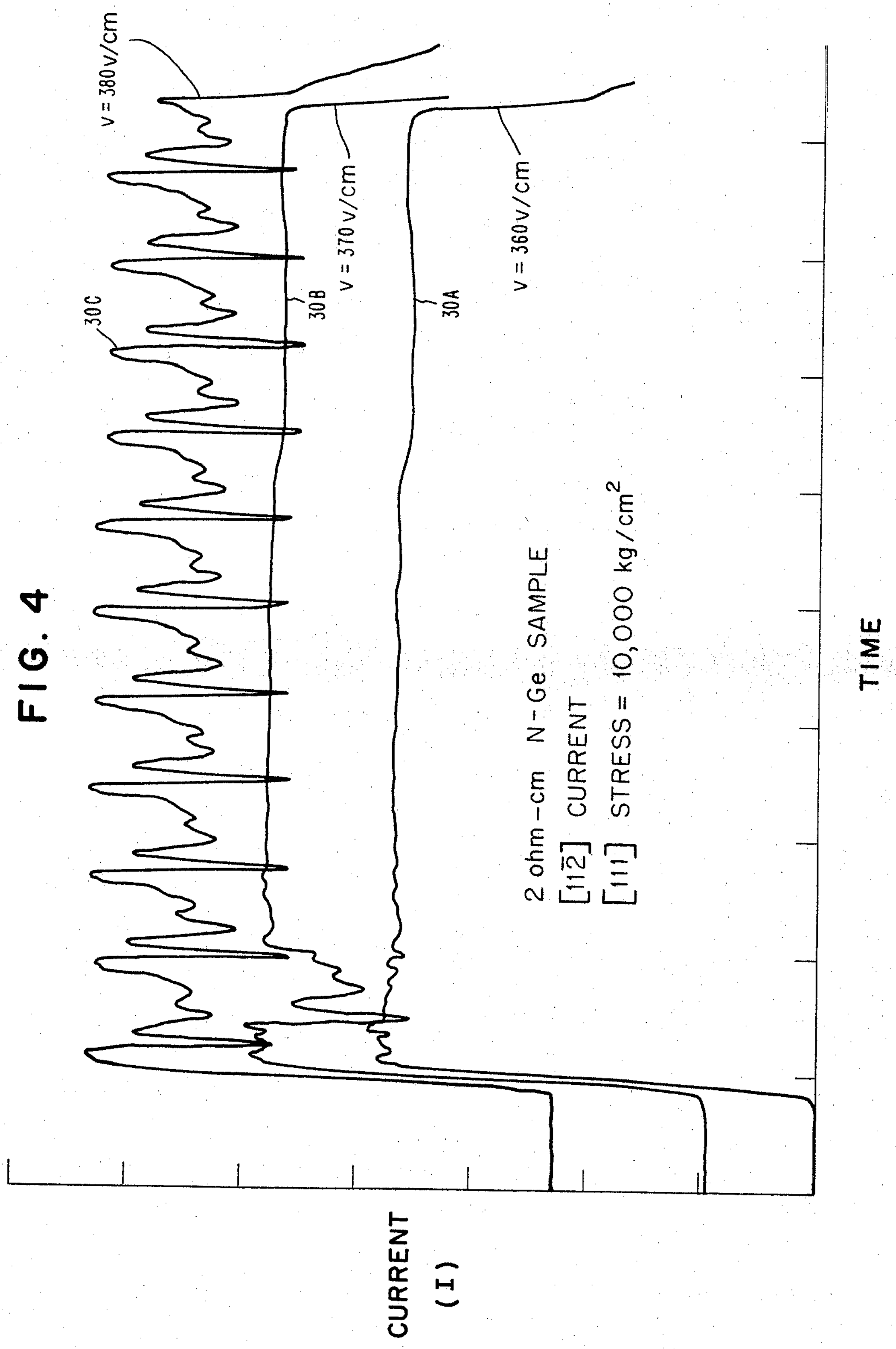
FIG. 4 is a curve depicting the manner in which current oscillations are produced in a body of germanium when the voltage applied to the body is raised so that the threshold field is exceeded.

FIG. 4 illustrates the nature of the oscillations which are obtained for one device of this type in which the stress was applied along the [111] direction and the current applied along the $[11\bar{2}]$ direction. In this figure, three plots are shown of the manner in which the current through the device varies with time when the stress is maintained at 10,000 kg. per cm.$^2$ and the field is raised from a point just below the threshold field to a point just above the threshold field. In the first curve designated 30A, the field applied is about 360 volts per cm., which is below threshold and no oscillations were observed. The same is true for curve 30B in which case the applied field is about 370 volts per cm. Curve 30C illustrates the oscillations which are obtained when the voltage is increased so that the applied field exceeds the threshold for this device which is about 375 volts per cm. The oscillations, as depicted, have a frequency of about (0.3) ($10^9$) cycles per sec., and are characteristic of the type obtained for a transit type mode "Gunn-Effect" oscillation. The amplitude of the oscillations is greater when the devices are operated at low temperatures and the threshold field is reduced greatly when the temperature of operation of the device is decreased. Thus, the very low threshold fields illustrated by the characteristic of FIGS. 3 and 4, are believed to be the lowest threshold fields at which oscillations of this type have been observed.

Figure 5:
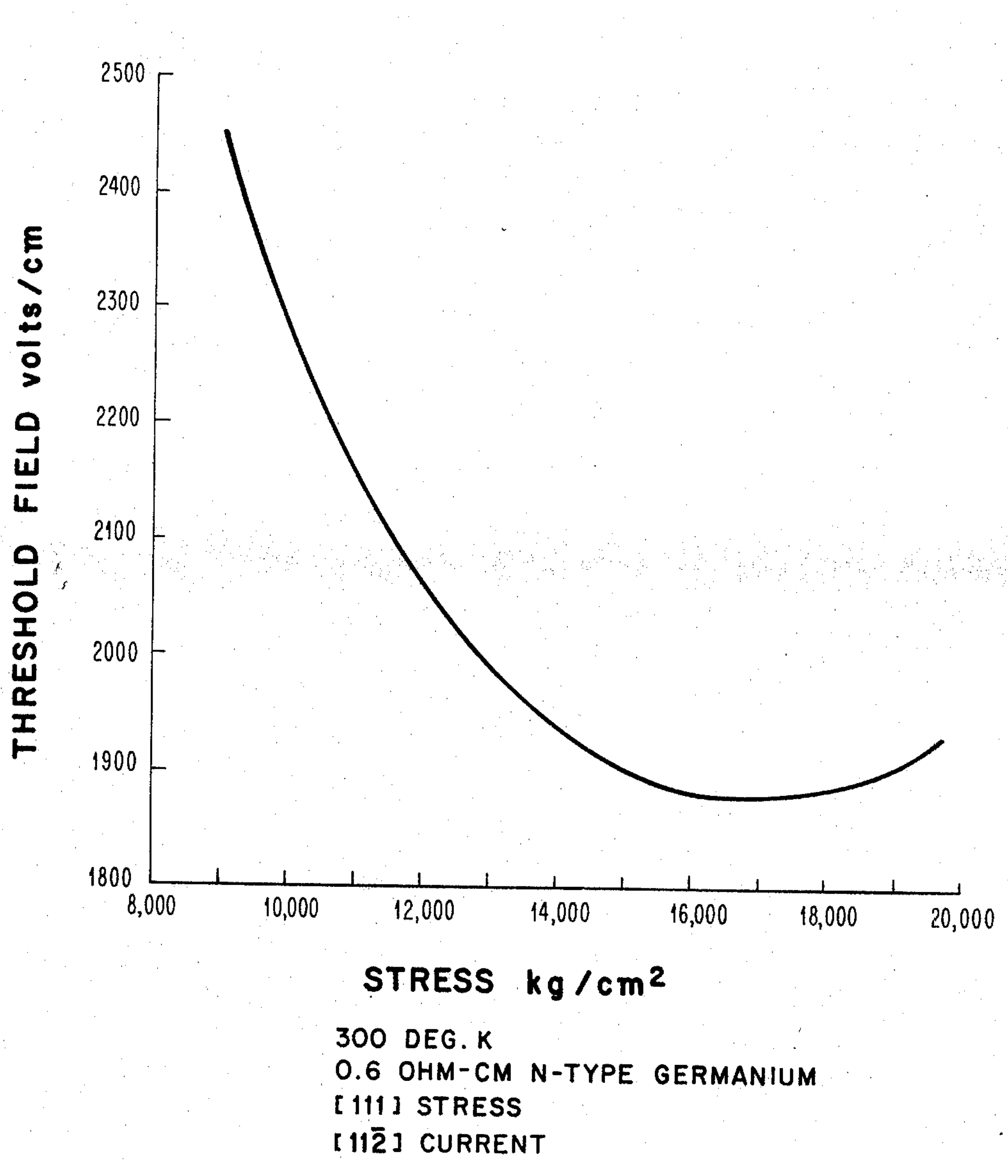
FIG. 5 is a plot depicting the threshold field-stress characteristic for a particular oscillator using a body of germanium having a resistivity of 0.6 ohm-cm. and operated at room temperature.

The threshold field for operation at room temperature is in the range of about 2000 volts per cm., as shown by the device characteristic of FIG. 5. This device is operated at room temperature with the stress applied along the [111] direction and the current along the $[11\bar{2}]$ direction. The germanium body for the device whose characteristics are shown in FIG. 5 is more highly doped than the germanium used in the devices described above and exhibits a lower resistivity of about 0.6 ohm-cm. The doping level, again using antimony, is about $2.7 \times 10^{15}$ atoms per cm.$^3$. As can be seen from FIG. 5, the lowest stress at which oscillations are produced is approximately 9000 kg. per cm.$^2$, and the optimum stress for producing oscillations at the lowest threshold field is in a range between 16,000 and 18,000 kg. per cm.$^2$. In this range, the threshold field for the production of oscillations is slightly below 1900 volts per cm. It should be noted, from the curve of FIG. 5, that there is an optimum stress which should be applied to allow production of the oscillations at the lowest threshold field. Further, this optimum condition exists over a relatively wide range of applied stress compared to the optimum conditions which exist at the lower temperature for the higher resistivity material whose characteristics are depicted in FIG. 3A. It is also noteworthy that the lower resistivity material, about 0.6 ohm-cm., provides better results, not only at room temperature, but also at the lower temperature.

Figure 8:
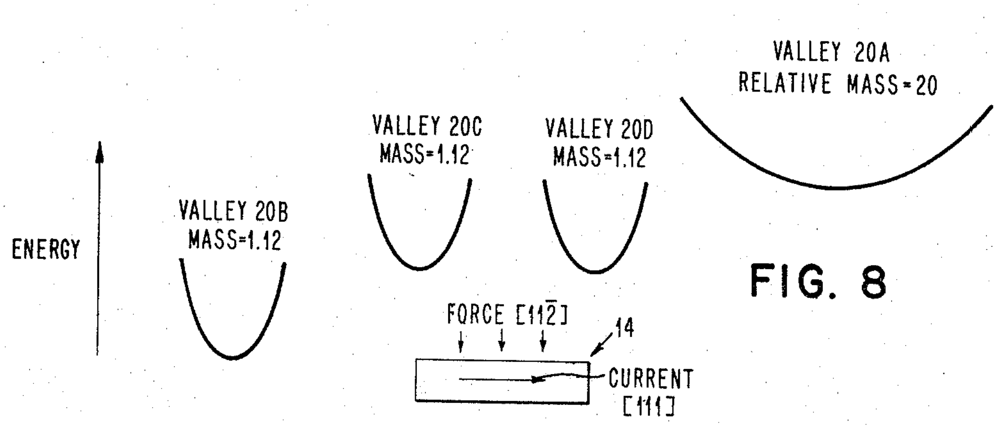

Another crystalline orientation which is preferred for the practice of the present invention is illustrated in FIG. 8. In the embodiment of this figure, the germanium crystal is oriented so that the compressive force is applied along the $[11\bar{2}]$ direction and the current is applied at right angles to the force along the [111] direction. The manner in which the four valleys 20A, 20B, 20C and 20D are split by this stress, and the relative mass of the electrons in the valleys for this direction of current flow are illustrated in FIG. 8. The valley 20B lying along the $[11\bar{1}]$ direction is lowered in energy by the application of the $[11\bar{2}]$ compressed stress. The major axis of the ellipsoid defining the constant energy surface of this valley is most nearly parallel to this direction of applied stress. The minimum energy of valleys 20C and 20D is raised somewhat relative to that of valley 20B, and the minimum energy of valley 20A, which is at right angles to the direction of applied stress, is raised by a greater amount relative to the energy of valley 20B.

It is important to note that when the stress is applied in the $[11\bar{2}]$ direction, which is not parallel to any of the $\langle 111 \rangle$ direction, the maximum energy splitting per unit of applied stress is realized. This is a significant characteristic since it is important in the design of actual devices, to minimize the amount of stress which must be applied to achieve oscillations at a reasonable value of threshold field. Further, as is illustrated in FIG. 8, the application of current in the [111] direction, which is perpendicular to the applied stress and parallel to the major axis of valley 20A, produces a very high ratio (almost 20–1) of the mass of the electrons in this high energy valley to the mass of the electrons in the lowest energy valley 20B. This high ratio of masses for electrons in the principal valleys involved in the energy transfer is achieved at the expense of a slightly higher mass of the electrons in the lowest energy valley 20B than is the case when the current is applied directly perpendicular to the major axis of one of the ellipsoids, as is the case in the embodiment of FIG. 6. The excess electrons in the germanium are located in the low energy valley 20B (FIG. 8) before the electric field is applied. The mass of the electrons is inversely proportional to their mobility. The field required to impart to the electrons sufficient energy to accomplish the necessary transfer to the high energy, high mass valley 20A, is generally proportional to the mobility of the electrons in the lower valley. Therefore, it is, generally speaking, desirable to apply the current in a direction which minimizes the mass of the electrons in the low energy valley. However, for the orientation of FIG. 8, the mobility of electrons in the low valley 20B is only slightly less, and the mass or mobility ratio between this valley and valley 20A is much higher than that achieved with the orientaton of FIG. 6.

It should be apparent from the description above, that the high frequency oscillations can be obtained in germanium only by a proper choice of the directions in which the stress and current are applied to the crystalline body. It is not sufficient for proper operation to merely apply the stress in one direction and the current in a direction which is at right angles to the stress. Thus, for example, as is illustrated in FIG. 7, where the stress and current are applied at right angles to each other though oscillations can be achieved, the device is inefficient since even though the applied stress does produce splitting of the valleys, the amount of splitting produced per unit of applied stress is less than that which can be achieved with other orientations. Further, with the orientation of FIG. 7, the current direction is not such as to maximize the ratio of the masses of the electrons in the highest and lowest energy valleys.

Thus, it becomes clear that the orientation in which the stress is applied to the crystal should be chosen so as to maximize the amount by which the relative energy of the valleys are changed per unit of applied stress. This is accomplished, for example, when the stress is applied either along a <111> direction or along a $\langle 11\bar{2}\rangle$ direction. There are four such <111> equivalent directions in the crystal, that is [111], $[\bar{1}11]$, $[1\bar{1}1]$, and $[11\bar{1}]$, and twelve equivalent <211> directions in the crystal. For each of the four possible <111> directions of applying stress, there are three <211> directions in which the current can be applied. A further parameter which should be considered in choosing the direction of applied stress is that in practical devices, which must withstand relatively high amounts of stress without cracking, it is easier to fabricate a semiconductor in the form of a parallelepiped. Therefore, the stress is applied to a surface of the body corresponding to a plane which is perpendicular to the direction in which stress should be applied. The contacts to which the voltages are applied to produce the electric field and current in the device are connected to two surfaces which are parallel to planes that are in turn perpendicular to the crystalline direction along which the current is applied. With this type of geometry, therefore, if the stress is applied along one of either the <111> or <112> directions, the current is applied along one of the <112> or <111> directions, respectively, which is perpendicular to the direction of the applied stress and allows for the fabrication of the device in the geometry of a rectangular parallelepiped.

The factors which must be considered in choosing the orientation of the crystal are illustrated in the embodiments of FIGS. 6 and 8. In the embodiment of FIG. 6, the stress is applied in the [111] direction to maximize the energy splitting produced per unit of applied stress, and the current is applied in the $[11\bar{2}]$ direction which is perpendicular to the major axis of the ellipsoid for valley 20A. Therefore, the electrons in this valley have the lowest possible relative mass and highest possible mobility. At the same time, differences in mass are achieved since this direction of applied current is very nearly parallel to the major axis of the ellipsoid for valley 20B and the electrons in that valley have a relatively high mass. Similarly, in the embodiment of FIG. 8, the current direction is chosen to maximize the difference in mass between the lowest energy valley 20B and the highest energy valley 20A; the applied stress is in a direction which gives maximum splitting per unit of applied stress, and though the mobility of the electrons in the lowest energy valley 20B is lowered from the maximum achievable, the amount by which the mobility is decreased is not very great.

A further characteristic of the devices in accordance with the principles of this invention, is that by the selective application the stress and currents in the proper direction, a novel and unusual relationship between the valleys is produced. Thus, in each of the embodiments shown, and for many other of combinations of applied stress and applied current in germanium, not only is an environment produced in which there are one or more low energy valleys and one or more high energy valleys between which electrons can be transferred, but there are present within the material, valleys which are intermediate valleys either in terms of the mass of the electrons in these valleys (valleys 20C and 20D in FIG. 6) or in terms of both the mass of the electrons and the energy of the valleys themselves (valleys 20C and 20D in FIG. 8). A further consideration illustrated by FIGS. 6, 7 and 8 is that it is preferable, from the standpoint of density of states, that the stress and current be applied in such a way that the number of high energy, low mobility valleys be at least as great as the number of low energy high mobility valleys.

It should also be apparent to those skilled in the art, that though for practical considerations in fabricating such devices at this stage of development, it is preferable to apply the stress and currents directly along easily established crystalline directions, such as the <111> and <112> directions, and to apply the stress and the current at right angles to each other, the orientation can be deviated somewhat without departing from the principles of the invention. Thus, for example, the stress and/or the applied current in the embodiments in FIGS. 6 and 8, can be applied in directions which differ slightly from the <111> and $\langle 11\bar{2}\rangle$ directions shown in those figures as long as the stress direction is chosen to produce significant energy splitting per unit of applied stress, and the current direction is such as to be at least nearly perpendicular to the major axis of the higher energy valley. A large range of geometrical relationships exist which may be chosen according to the particular application for which the device is fabricated, and the particular mode (transit time, domain quenching, or limited space charge) in which the device, once fabricated, is to be operated. The same is true in choosing the orientations of applied stress and current to control the energy of the intermediate valleys, and/or the mass of electrons in these valleys relative to the energy and mass in the lowermost and uppermost valleys within the germanium crystal.

From the description of the various embodiments of germanium high frequency oscillations, it is clear that the oscillations are dependent upon the transfer of electrons from low energy valleys in which they have high mobility to a higher energy valley in which they have low mobility. The low and high energy valleys involved are valleys which are of equal energy when the germanium is in an unstrained state, and which are split in energy when the germanium is strained in the proper direction. The negative resistance effect is produced in the direction of applied field and is realized by the applications of the field to produce current flow in a direction which takes advantage of the anisotropy of the constant energy surfaces of the valleys. An optimum stress condition is realized at each temperature of operation, that is, for each device there is an optimum stress at which oscillations are produced at the lowest value of applied electric fields. This optimum is believed to be related to the manner in which the normally equal energy valleys are split by the applied stress, and the fact that the drift velocity-field characteristic of the electrons in the valleys exhibits some degree of saturation in the range of applied fields used to produce the oscillations.

Though the embodiments described here in detail have all employed germanium in the active device, the practice of the invention is not limited to this material. Other materials, such as silicon and lead telluride, have the type of energy band structure which can be taken advantage of by the application of properly oriented current and stress. Silicon, for example, has six equivalent, conduction band valleys which are lowest in energy. These valleys are located along <100> directions and are anisotropic. They can be split by the application of a properly directed uniaxial stress (e.g., [100] direction) and a current can be applied in a proper direction (e.g., [010] direction) for which the electrons in the low energy valleys have high mobility and the electrons in some of the higher energy valleys have low mobility. The anisotropy of the constant energy surfaces in silicon is not as pronounced as in germanium, but this is compensated for by the fact, that, in silicon, the valleys are perpendicular to each other so that current can be applied in a direction to take complete advantage of the existing anisotropy. Further, though the primary use of the negative resistance effect produced by the application of properly oriented stress and current, as described above, is in high frequency oscillators, the principles of the invention can also be employed in building other devices such as amplifiers.

While the invention has been particularly shown and described with reference to preferred embodiments thereof, it will be understood by those skilled in that art that various changes in form and details may be made therein without departing from the spirit and scope of the invention.

We claim:

1. The method of producing high frequency oscillations with a body of germanium having an excess of electrons which in the absence of strain are located in four equivalent low energy valleys whose constant energy surfaces are represented by ellipsoids having major axes parallel to the <111> directions in germanium, comprising the steps of:

(a) splitting the energy levels of said valleys by applying to said germanium body in a first direction a stress in excess of a threshold stress necessary to be exceeded to allow said oscillations to be produced, and (b) applying to said stressed germanium body in a second direction perpendicular to said first-direction an electric field above a threshold field necessary to produce oscillating current flow in said second direction;

(c) one of said first and second directions being in one of the <111> directions parallel to the major axis of one of said ellipsoids, and the other of said directions being one of the crystalline directions which is perpendicular to said one direction and most nearly parallel to the major axis of one of the remaining three ellipsoids.

2. The method of claim 1 wherein said stress is a uniaxial stress applied along one of said <111> directions.

3. The method of claim 2 wherein said stress is applied in the [111] direction and said field is applied to produce current flow in the $[11\bar{2}]$ direction.

4. The method of claim 1 wherein said field is applied to produce current flow in a <111> direction in said germanium.

5. The method of claim 1 wherein the characteristic of said germanium depicting the relationship between applied stress and the threshold field necessary to produce oscillations exhibits a narrow range of applied stress for which the threshold field is minimized, and said applied stress is maintained within said narrow range.

6. The method of producing high frequency oscillations with a body of N type semiconductor material having an excess of carriers of negative conductivity type which in the absence of strain are located in more than two equivalent low energy conduction band valleys comprising the steps of:

(a) separating the energy of said equivalent low energy valleys by applying to said body in a first direction a stress which causes a first one only of said valleys to be at an energy lower than the remaining ones of said valleys, said first direction being one in which the maximum attainable energy splitting between said first valley and at least a particular one of the remaining valleys per unit of applied stress is obtained;

(b) and applying to said body in a second direction a field in excess of the threshold field necessary to produce oscillatory current flow in said body, said second direction being a direction which maximizes the ratio of the mass of the electrons in said particular one of the remaining valleys to the mass of the electrons in said first valley.

7. The method of claim 6 wherein the characteristic for said body depicting the relationship between applied stress and threshold field necessary to produce oscillations exhibits a narrow range of stress for which the threshold field is minimized, and said applied stress is maintained within said narrow range.

8. The method of claim 6 wherein, when said stress is applied to said body in said first direction, a third one of said equivalent valleys is caused to be at an energy intermediate to the energies of said first and second valleys.

9. The method of claim 6 wherein, when said electric field is applied to produce current flow in said second direction, the mass of the excess carriers in a third one of said normally equivalent valleys is intermediate the masses of electrons in said first and third valleys.

10. The method of claim 6 wherein said semiconductor material is germanium.

11. The method of claim 10 wherein said semiconductor material is N type germanium having a resistivity between 0.1 and 2.0 ohm-cm.

12. The method of claim 6 wherein said semiconductor material is silicon.

13. A semiconductor circuit comprising:

(a) a body of N type germanium having first and second surfaces which are parallel to each other and third and fourth surfaces which are parallel to each other and perpendicular to said first and second surfaces;

(b) means for applying a uniaxial compressive stress in a first direction on said first and second surfaces;

(c) means for applying an electric field between said third and fourth surfaces to produce current flow in a second direction perpendicular to said third and fourth surfaces and to said uniaxial stress applied between said first and second surfaces;

(d) one of said first and second directions being one of the four <111> crystalline directions in said germanium and the other of said first and second directions being a direction which is perpendicular to said one direction and most nearly parallel to one of the three remaining <111> directions in the germanium;

(e) a load connected to said body of germanium;

(f) and said electric field exceeding the field necessary to produce negative resistance in said second direction in said stressed germanium.

14. The semiconductor oscillator of claim 13 wherein said first direction in which said uniaxial stress is applied is a <111> direction.

15. The semiconductor oscillator of claim 13 wherein said second direction in which said current is applied is a <111> direction.

16. The semiconductor oscillator of claim 13 wherein said circuit is an oscillator circuit and applied stress is maintained at a value at which the threshold field for producing oscillations is minimized.

17. The oscillator of claim 16 wherein said applied stress is between 16,000 and 18,000 kg. per $cm.^2$.

18. The semiconductor oscillator of claim 13 wherein said germanium has a room temperature resistivity between 0.1 and 2.0 ohm-cm.

19. The semiconductor oscillator of claim 13 wherein said room temperature resistivity of said germanium is about 0.6 ohm-cm.

References Cited

UNITED STATES PATENTS

| | | | |
|---|---|---|---|
| 3,215,862 | 11/1965 | Erlbach | 317—234 X |
| 3,408,594 | 10/1968 | Allen et al. | 331—107 |

OTHER REFERENCES

Ridley et al., The Possibility of Negative Resistance Effects in Semiconductors, Proceedings of Physical Society (London), vol. 78, August 1961, pp. 293–304, 331–107 G.

Shyam et al., Effect of Variation of Energy Minima Separation on Gunn Oscillations, IEEE Transactions on Electron Devices, January 1966, pp. 63–67, 331–107 G.

Smith, Jr. et al., Effect of Compressive Uniaxial Stress on High Field Domains in n-Type Ge, Applied Physics Letters, Dec. 15, 1967, pp. 372–374, 331–107 G.

ROY LAKE, Primary Examiner

S. H. GRIMM, Assistant Examiner

U.S. Cl. X.R.

317—234